US006148086A

United States Patent [19]

Ciullo et al.

[11] Patent Number: 6,148,086

[45] Date of Patent: Nov. 14, 2000

[54] METHOD AND APPARATUS FOR REPLACING A VOICE WITH AN ORIGINAL LEAD SINGER'S VOICE ON A KARAOKE MACHINE

[75] Inventors: William R. Ciullo; Nancy L. Reyes, both of Fremont; David P. Berners, Mountain View, all of Calif.

[73] Assignee: Aureal Semiconductor, Inc., Fremont, Calif.

[21] Appl. No.: 08/857,317

[22] Filed: May 16, 1997

[51] Int. Cl.[7] .......... H03G 7/00

[52] U.S. Cl. .......... 381/106; 434/307 A; 84/627; 84/663

[58] Field of Search .......... 381/104, 105, 381/106, 107, 103, 119, 122; 434/307 A; 84/626, 627, 662, 663

[56] References Cited

U.S. PATENT DOCUMENTS 4,881,123 11/1989 Chapple .......... 381/119
5,276,764 1/1994 Dent .......... 381/106

FOREIGN PATENT DOCUMENTS 2623931 6/1989 France .......... 381/119

OTHER PUBLICATIONS

Nippon, Columbia Co., Ltd., Tokyo, Japan, Denon "MIC Mixing Pre Amplifier HMA–500" Operating Instructions.

*Primary Examiner*—Minsun Oh Harvey
*Attorney, Agent, or Firm*—Ritter, Van Pelt & Yi LLP

[57] ABSTRACT

A voice replacing method and system that uses the volume of the karaoke user's voice to control the volume of the lead singer's original vocal outputted to the audience. The volume of an original lead singer's voice is determined by the volume or vocal-amplitude level of the karaoke user's voice. The vocal-amplitude of the karaoke user is sensed using a vocal sensor. A vocal-amplitude digital waveform is created corresponding to the vocal-amplitude. A smoothed exponential waveform is created byan amplitudefollower corresponding to the digital waveform. The volume of the original lead singer's voice is adjusted by a sliding balance according to the smoothed exponential waveform. This exponential waveform allows for a continuous and smooth volume adjustment of the original lead singer's voice according to changes in volume of the karaoke user's voice.

30 Claims, 8 Drawing Sheets

Vocal Follower

Unclipped Vocal-Amplitude Waveform

Clipped Vocal-Amplitude Waveform

Smoothed Exponential Waveform

METHOD AND APPARATUS FOR REPLACING A VOICE WITH AN ORIGINAL LEAD SINGER'S VOICE ON A KARAOKE MACHINE

BACKGROUND OF THE INVENTION

1. Field of the Invention

The present invention relates generally to karaoke machine technology, and specifically to a method and apparatus for using a karaoke user's vocal amplitude or voice volume to control the volume of the original lead singer's vocal which is mixed or merged with a background music track and outputted through loudspeakers to the audience.

2. Description of Related Art

Before discussing the present invention and the prior art, certain terms should be defined. As used herein: a "song" means "background music" plus "lead vocal". "Background music" is intended to mean instruments and background vocals and "lead vocal" is intended to mean the lyrics portion of the song sung by the lead singer without any instruments. An original mixed recording or "OMR" includes the lead singer original vocal and the instrumental or music part of the song. The "karaoke user" is the person who is singing, speaking, or sending sound through a microphone to the karaoke machine.

The basic and most common karaoke machines output the instrumental portion of a song with the lead vocal removed, and substitute in its place the voice of the karaoke user singing the vocal through a microphone. The karaoke user's voice and the music of the song are mixed and outputted, typically to an audience. If the karaoke user has not memorized the lyrics to the song or the placement of those lyrics in the song, there is usually a visual prompt on a screen in view of the karaoke user displaying the lyrics of the song at the appropriate times.

Karaoke, although very popular in Far Eastern countries, such as Korea and Japan, has not been popular in Western culture, particularly in the United States. Although it may not be possible to pinpoint one specific reason karaoke has not been popular with Americans, and with Westerners in general, one factor may be that they are uncomfortable with the sound of their voices. Individuals are typically self-conscious about the sound of their voice and maybe disappointed with the tone or quality of sound they produce through a karaoke machine. It is likely that if they could sound more like the actual singer, karaoke would be a greater source of entertainment. Another factor may be that they do not like having to sing the exact lyrics to a particular song even though they may like the song or like the idea of performing the song; they may rather hum the melody or make sounds that mimic or sound similar to the actual lyrics. Although the reasons for karaoke's unpopularity may be varied, it is likely that enabling the karaoke user to sound more like or exactly like the original singer would eliminate many of the barriers keeping people from using it in this country and make it more entertaining to Western audiences.

One enhancement to the basic functionality of karaoke and attempt at making it more accessible to the novice is a feature called vocal partnering. This feature enables outputting the OMR when the karaoke user's voice drops below a certain volume level. Thus, if the karaoke user is not singing at all or is singing too softly, the audience and the karaoke user will hear the OMR which is simply the lead singer's original vocal with the music and background vocals. The karaoke user may have lost his or her place in the song or momentarily forgotten the lyrics or melody. Hearing the OMR can assist the karaoke user in getting back on track in the song. Once the karaoke user starts singing louder and is more audible to the audience, the OMR is removed and the karaoke user is again heard with the music. In most cases, the OMR is not heard by the audience because the karaoke user is normally singing at an audible level. When the OMR does come on, it does so at a set volume and does not change until going off if the karaoke user starts singing again.

FIG. 1 is a block diagram of a karaoke machine which includes vocal partnering, or what is referred to as Duet Mode. The song input is comprised of two audio streams: one carrying only background music on a signal 101, and another carrying OMR on a signal 102. Signal 101 is inputted directly into a mixer 107. Signal 102 is fed into a Duet Mode enabler 103 which contains a discrete ON/OFF switch. A microphone 104 used by the karaoke participant is connected to a Duet Mode enabler 103. The strength of the signal sent through the microphone controls the ON/OFF switch. If the switch is ON, the Duet Mode enabler 103 is activated as a result of receiving a low amplitude 106 from the karaoke user via the microphone 104. The Duet Mode enabler 103 senses the volume or vocal-amplitude 106 of the karaoke user's voice through the microphone. If it senses that the vocal-amplitude 106 is below a certain level because the karaoke user is singing too softly or not at all, it will assist or boost the volume of the vocals heard by the audience by adding the OMR through the switch. The enabler 103 will switch ON by outputting the OMR at a set volume level thus making the vocals more audible to the audience. If the karaoke user starts singing louder, the Duet Mode enabler 103—constantly sensing the user's vocal-amplitude—will switch OFF and stop outputting the OMR completely.

When Duet Mode is enabled, OMR signal 102, inputted to the enabler 103 is routed to a mixer 107. Mixer 107 takes OMR signal 102 and adds it to the voice of the karaoke user 109. For example, if the song being played is by Frank Sinatra, the volume of his voice remains constant once Duet Mode has been enabled. Duet Mode is enabled when the amplitude of the karaoke user is low (i.e. when the karaoke user is singing softly or not at all). This is so that there is always some vocal being projected to the audience. As mentioned above, it can also help the uncertain karaoke user find his or her place in the song or recall the vocal melodic line in the song. When the karaoke user is singing at a normal or loud volume level, Duet Mode is disabled and signal 101 consisting only of background music is routed to mixer 107. Mixer 107 creates an audio stream 108 consisting of the karaoke user's voice 109 and the background music, which is projected to the audience through loudspeakers 110 and illustrates typical karaoke operation.

Thus, vocal partnering ensures that some vocal is always being output by the karaoke machine. The OMR is outputted when the karaoke user's volume falls below a threshold level. It should be further noted that vocal partnering through a Duet Mode enabler does not allow for adding, at varying volume levels, the OMR according to how loud the karaoke user is singing. The audience will clearly hear, for example, Frank Sinatra's voice go on or off depending on how loud the karaoke user is singing.

Although vocal partnering is helpful in assisting a karaoke user and ensuring that some vocal is always output to the audience, it does nothing to change the tone or quality of the karaoke user's own voice. As described, so long as the karaoke user is singing above a certain level, Duet Mode will be OFF and the raw user's voice will be heard.

What is needed is a karaoke machine that allows novice, unskilled, or self-conscious singers to sound more like the original lead vocalist to an audience while still allowing the unskilled singer to creatively interact with the song and audience and control the performance.

SUMMARY OF THE INVENTION

Accordingly, the present invention provides a method and apparatus for outputting to an audience the lead singer's original vocal by allowing the karaoke user to transmit sounds (vocal-amplitude) that control the volume and rate of volume adjustment of the lead singer's original vocal thereby creating an illusion that the karaoke user's voice is the same as the lead singer's original voice.

In one embodiment, a method for merging a varying amount of an original lead singer vocals with an instrumental audio stream wherein the amount of the lead singer vocals depends on the vocal-amplitude of the karaoke user is disclosed. In this aspect of the invention, the karaoke machine senses the vocal-amplitude from the karaoke user in analog and converts it to a vocal-amplitude digital waveform. The vocal-amplitude digital waveform is then used by a vocal follower to create a smoothed exponential waveform. The smoothed exponential waveform is then used to adjust a variable mixer which controls the amount of the original lead singer vocals and instrumental audio stream outputted by the karaoke machine. In some embodiments, the original lead singer vocals is removed from non-karaoke audio streams by combining a non-vocal, low-end audio stream and a non-vocal high-end audio stream.

In one embodiment, the audio stream, comprised of the original lead singer vocals and instrumental audio stream, and the vocal-amplitude analog signal are converted to a digital stream and processed by a digital signal processor to obtain a digital stream. In still another embodiment, the vocal-amplitude digital signal having a vocal-amplitude digital waveform is compressed as not to exceed a maximum amplitude.

In another embodiment, the vocal-amplitude digital waveform is clipped to remove either the negative or positive portions of the waveform. In still another embodiment, the smoothed exponential waveform is formed using an attack rate and decay rate to form the ramps and decays comprising the smoothed exponential waveform. In still another embodiment, the variable mixer mixes the instrumental audio stream and the original lead singer vocals according to the amplitude of the smoothed exponential waveform.

These and other features and advantages of the present invention will be presented in more detail in the following specification of the invention and the figures.

BRIEF DESCRIPTION OF THE DRAWINGS

The invention, together with further aspects, objects, features and advantages thereof will be more clearly understood from the following description considered in connection with the accompanying drawings in which like elements bear the same reference numerals throughout the various Figures.

DETAILED DESCRIPTION OF THE PREFERRED EMBODIMENTS

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims.

Figure 1:
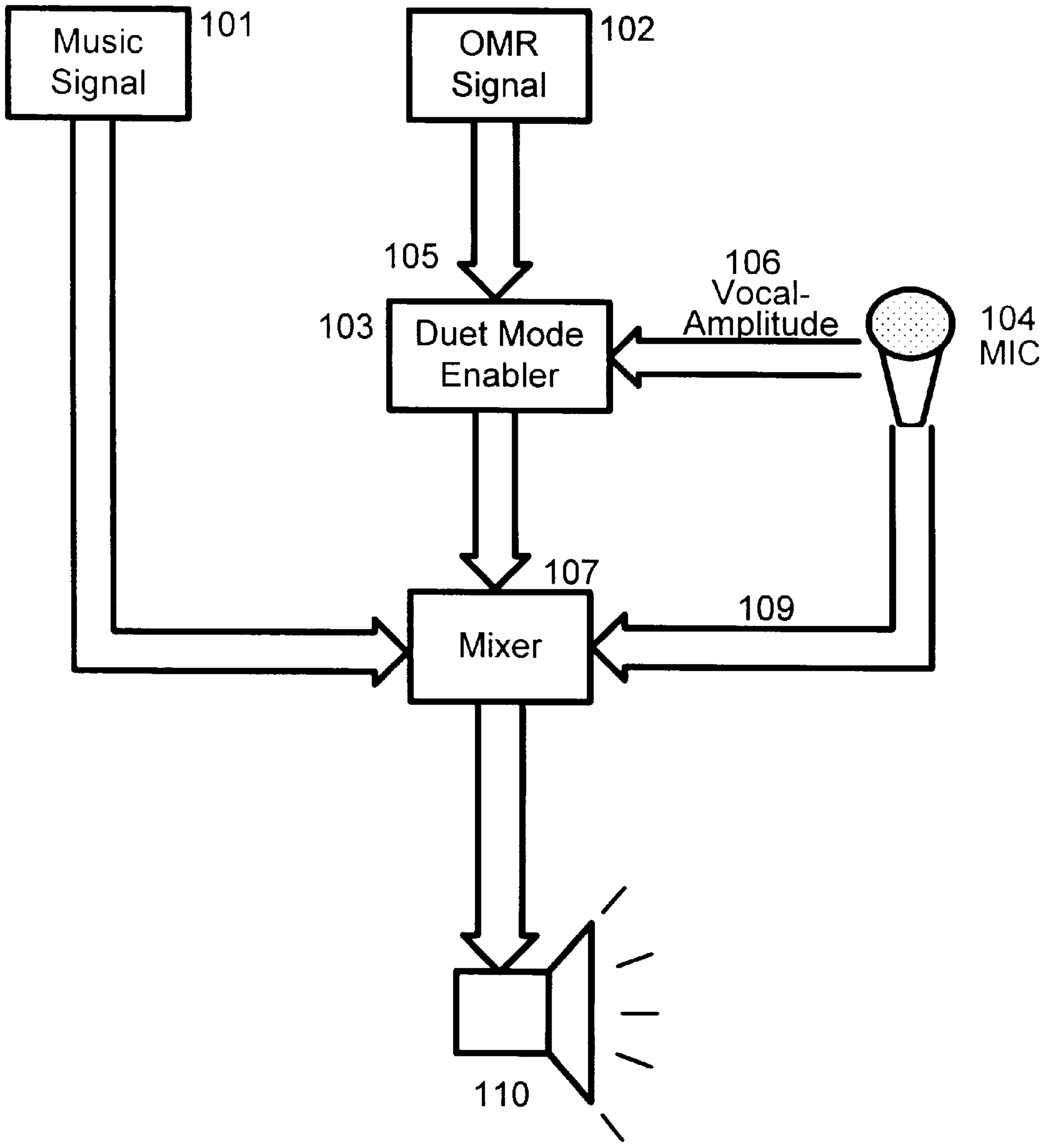
FIG. 1 PRIOR ART
FIG. 1 is a block diagram of a conventional karaoke machine which allows for vocal partnering or Duet Mode for use in karaoke machines wherein the original lead vocal is outputted if the karaoke user's voice drops below a certain volume.
Figure 2:
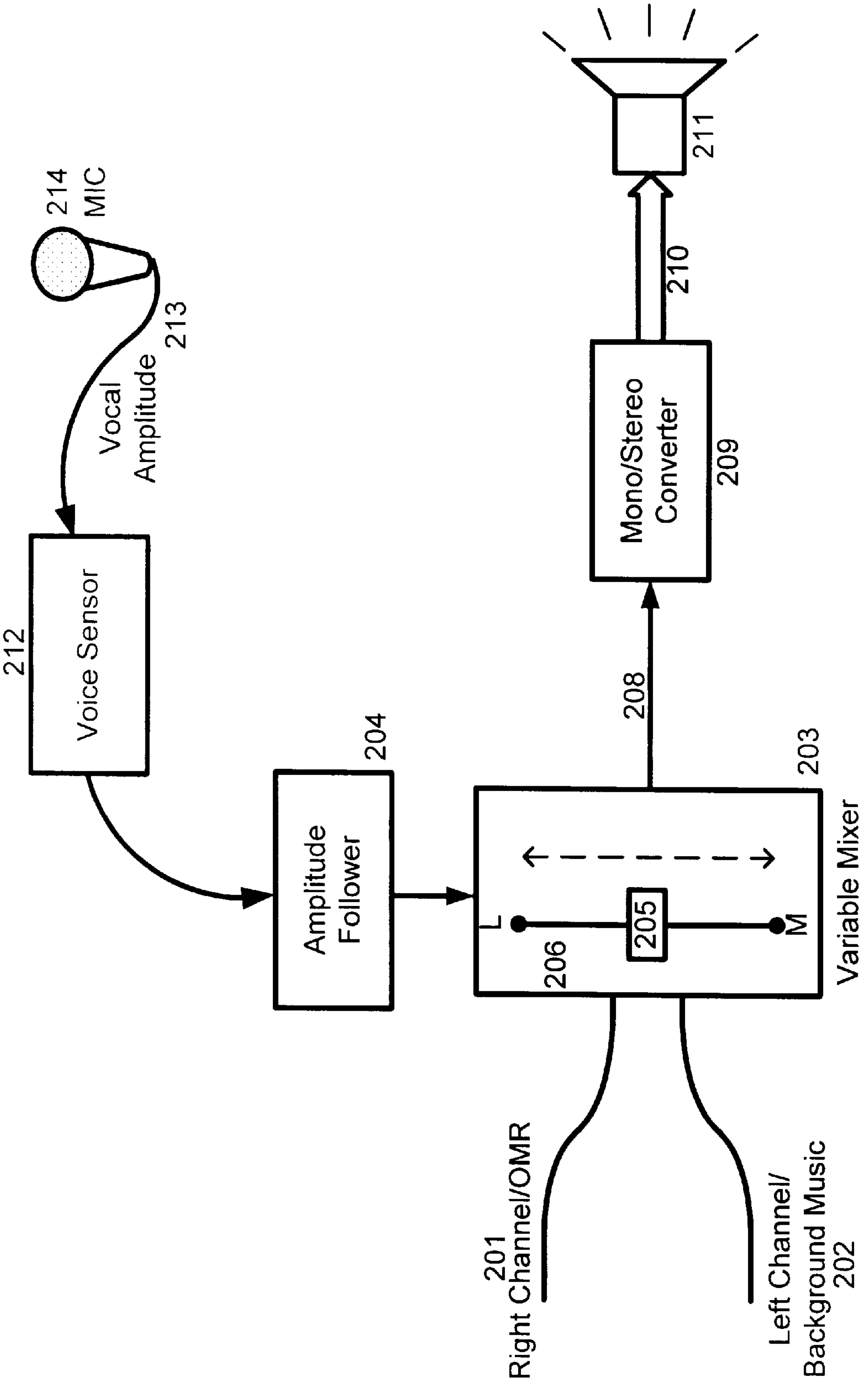
FIG. 2 is a block diagram showing components of the virtual singer karaoke machine.
Figure 3:
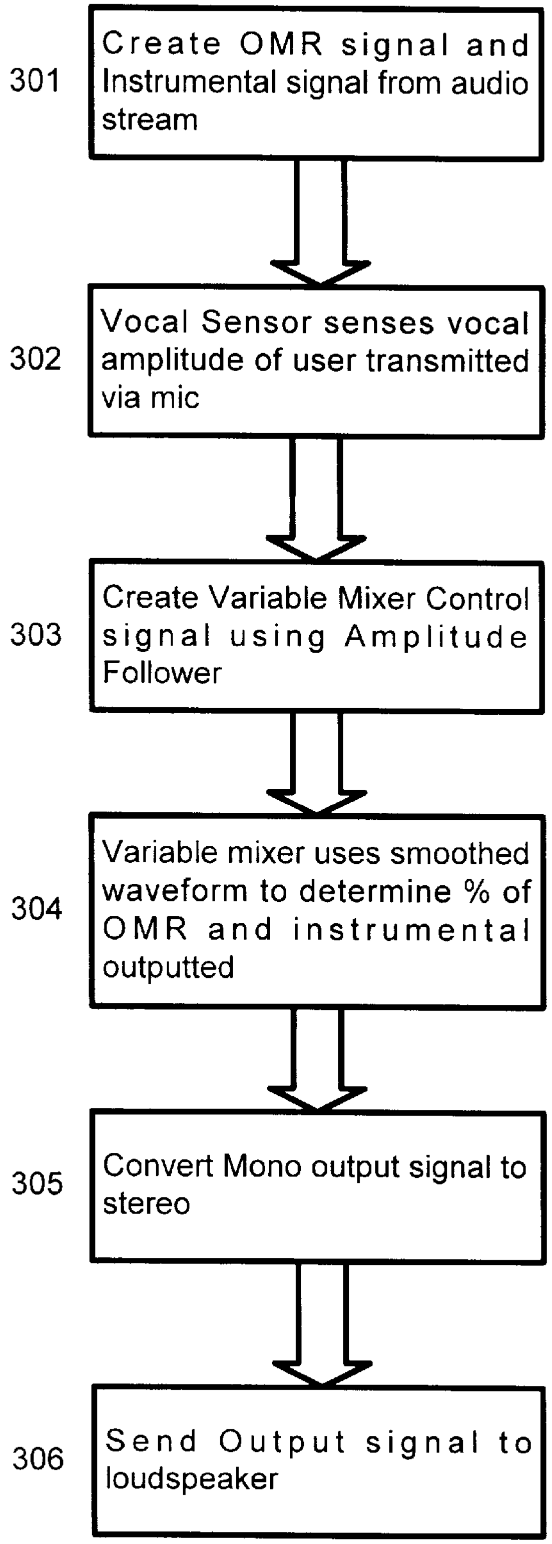
FIG. 3 is a flowchart illustrating the steps of the present invention wherein the karaoke user's voice audio stream and the karaoke audio stream are mixed and outputted in stereo.

FIG. 2 is a block diagram showing components used in one embodiment of the present invention for mixing in the OMR according to the volume of a karaoke user. A karaoke audio stream consisting of a first channel 201 and a second channel 202 are inputted to a variable mixer 203. The first channel 201 contains the OMR which is comprised of the lead singer's original vocal and all the background music (i.e. the complete song). The second channel 202 contains only the background music. The variable mixer reads data from an amplitude follower 204. The data from the amplitude follower is in the form of a smoothed exponential waveform. This smoothed waveform guides the slider along the balance 206 between points M and L. Points M and L, as described below with regard to FIG. 3, represent the two end points of the balance. If the slider is at point M, the variable mixer only outputs a background music audio signal. If the slider is at point L, the mixer outputs only the OMR audio signal. If in between, each of the two channels 201 and 202 comprise a certain percentage of the output.

The amplitude follower 204 creates a smoothed exponential waveform from vocal-amplitude analog signals it receives from a vocal sensor 212. The vocal-sensor senses the vocal-amplitude 213 of the karaoke user from a microphone 214. It derives vocal-amplitude analog signals from the user's raw vocal-amplitude. The variable mixer 203 outputs a single channel 208 which is fed into a mono-stereo converter 209. The mono-stereo converter 209 converts the inputted mono audio stream 208 into a stereo audio stream 210 which is then amplified and outputted through loudspeakers 211.

Figure 4:
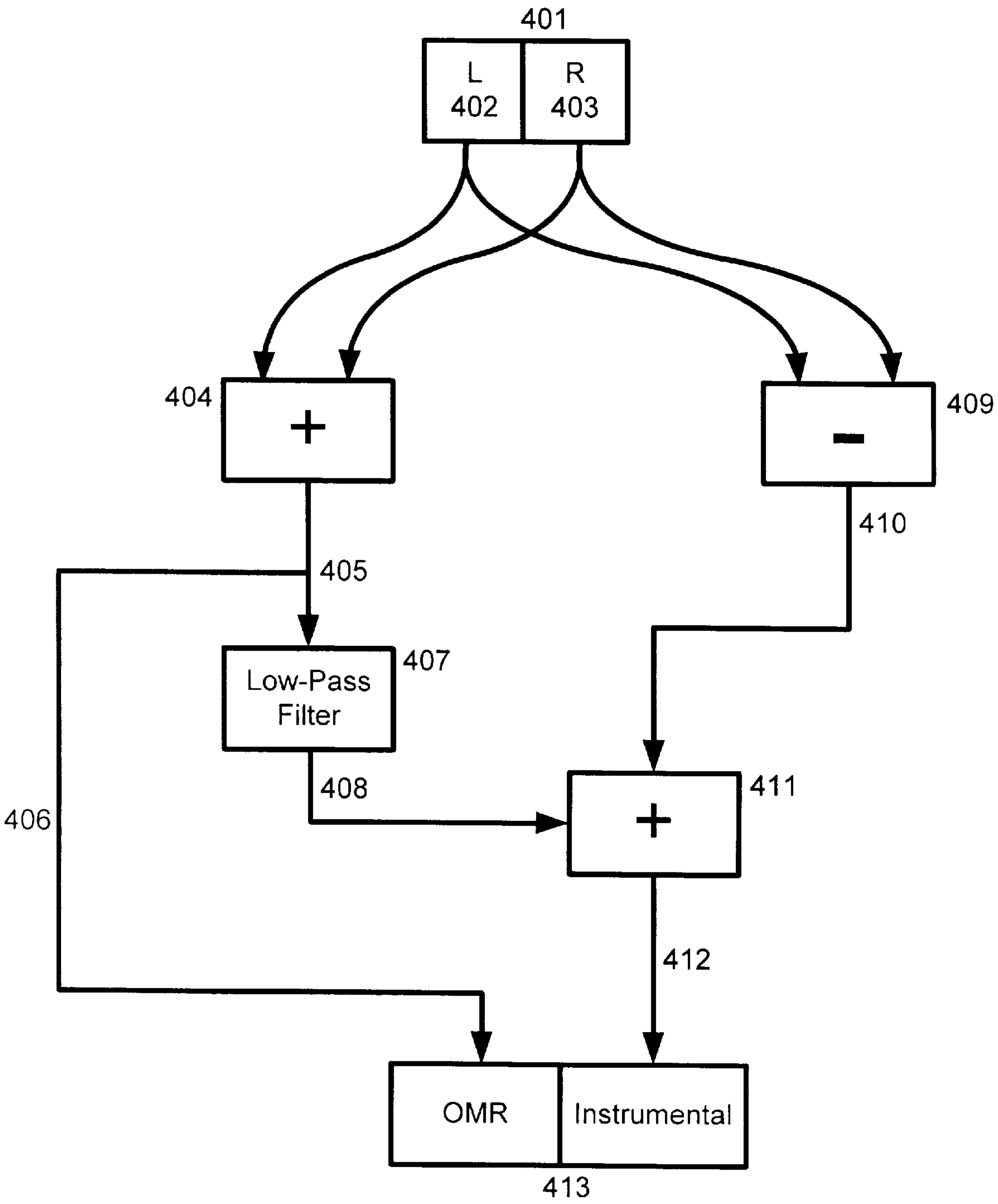
FIG. 4 is a diagram illustrating the process of producing a karaoke audio stream from a non-karaoke audio stream.

FIG. 3 is a flowchart illustrating the steps in one embodiment of the present invention. In step 301, an audio stream is separated into two signals: OMR signal and instrumental signal. If the audio stream is a karaoke audio stream, this step is unnecessary because a karaoke audio stream is initially recorded to have these two separate signals. This is because an audio stream for a karaoke machine must have one signal or channel that is background music (i.e. the song without the lead vocal) and an OMR channel which outputs the song in its entirety. As discussed below, these channels are mixed according to the karaoke user's voice level and outputted to the audience. On the other hand, channels in a typical stereo (non-karaoke) audio stream contain a mix of different parts of a song on each channel. FIG. 4, discussed in detail below, illustrates the process of converting a normal stereo audio stream to a karaoke audio stream. Next, in step 302, a karaoke user transmits sound through a microphone to a vocal sensor which senses the vocal-amplitude of the transmitted sound. The vocal-amplitude is essentially the energy level of the karaoke user's voice. The user's vocal-amplitude is the entity that is processed and is eventually used to control the output from the karaoke machine. The karaoke user is not required to sing the lyrics of the song being played. He or she need only transmit some sound to the vocal sensor—such as humming or even singing lyrics to another song—in order for the karaoke machine output to contain some OMR.

Figure 6:
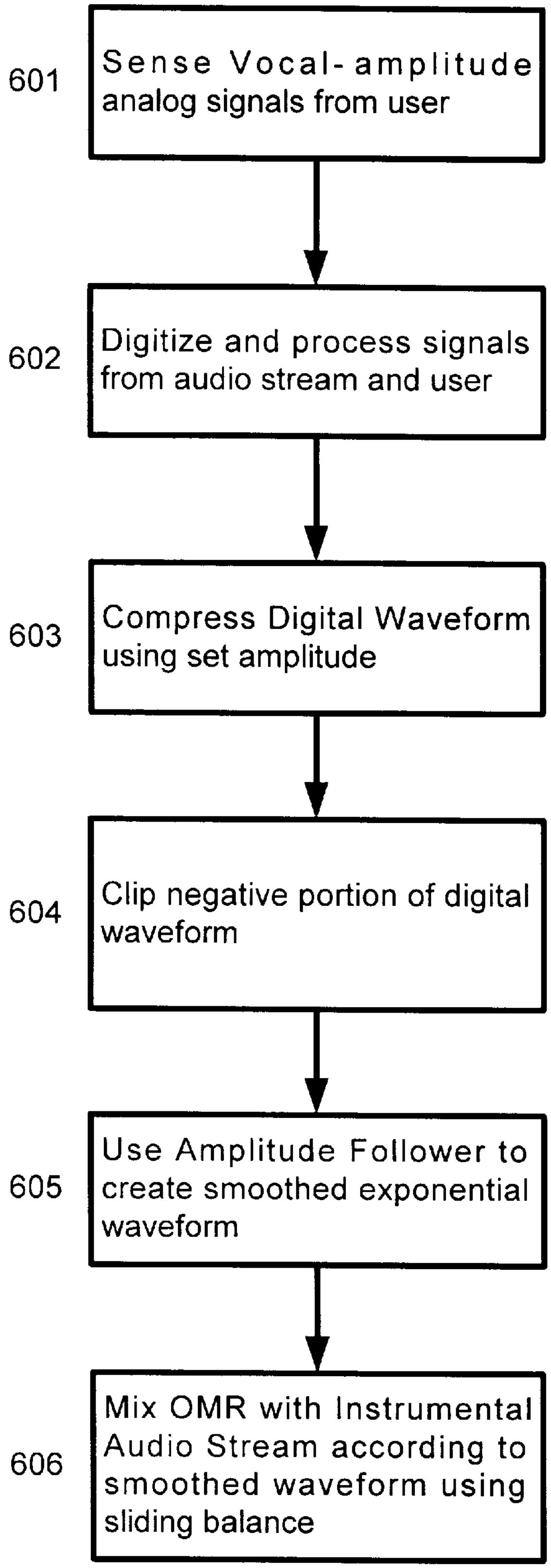
FIG. 6 is a flowchart illustrating a method of creating a smooth exponential waveform from the karaoke user's vocal amplitude to be used as a balance slider to proportionally mix audio streams.

In step 303, the user's vocal-amplitude analog signals is used to create a smoothed exponential waveform. This process is shown in more detail in FIGS. 6 and 8. FIG. 6 is a detailed flow chart of the steps necessary for creating the smoothed wave form that controls the variable mixer. The vocal-amplitude analog signals are digitized, see FIG. 7, and a vocal-amplitude waveform is created. The vocal-amplitude waveform tracks the user's vocal-amplitude exactly and is, by its nature, very likely to be choppy and somewhat erratic. This is because the human voice changes volume almost constantly and therefore any waveform representing the vocal-amplitude of a human voice will be jagged and sharp. If used directly to adjust the OMR volume, this type of waveform would not make for continuous and pleasant-sounding changes in volume of the OMR. Instead, the vocal-amplitude waveform is used to create a corresponding smoothed exponential waveform. The smoothed waveform is essentially put together with curves (i.e. attacks and decays) that follow the rises and falls in the original vocal-amplitude waveform. Superimposing these curves on the original vocal-amplitude waveform and creating the smoothed exponential waveform is done by an amplitude follower. The amplitude follower essentially follows the rises and falls in the karaoke user's vocal-amplitude and creates a smoother and gradual waveform. This process is shown in more detail in FIG. 8C.

Step 304 uses the smoothed exponential waveform to change the volume of the OMR in a continuous and non-erratic manner. The smoothed waveform is used to guide a variable mixer which essentially acts as a sliding balance. The sliding balance has two end points or extremes. As discussed with regard to FIG. 2, one end point, M, represents outputting only a background music stream. If the slider is at this end of the balance, the variable mixer will output only the instrumental and background vocals of a song. The other end point, L, represents outputting only the OMR audio stream. If the slider is at this end of the balance, the variable mixer will output 100% of the song as it was originally recorded with all instruments, background vocals, and lead vocals. The smoothed waveform is used to guide the slider between M and L. Thus, when the smoothed waveform is at its maximum amplitude which represents the highest allowable vocal-amplitude from the karaoke user, the slider is guided to L. This will output 100% of the lead singer's voice (along with the rest of the song) at the maximum volume level. If the karaoke user is not singing at all, the smoothed waveform will be flat at the lowest amplitude. This will cause the slider to move to M and only background music will be outputted with no lead singer's vocal. These are the two extremes. Most of the time the smoothed waveform will move the slider in between L and M. In these cases different percentages of the OMR audio stream and music audio stream are outputted. For example, if the karaoke user is not singing very loud but is singing (or transmitting sound) at a normal volume level, the slider may be set so that the variable mixer mixes 70% of the OMR and 30% of the background music audio stream to create the total output. If the user begins to lower the volume of her own voice because she wants the lead vocals in that part of the song to be softer, the smoothed exponential waveform will begin decaying gradually. This will cause the slider to move closer to the M end point. As a result the variable mixer may mix 45% of the OMR with 65% of the background music audio stream. Because the OMR went from 70% of the total output to 45% and the background music audio stream increased proportionally, the lead vocals will not be heard as much. The smoothed exponential waveform allows the adjustment from 70% OMR to 45% OMR (or 30% background music to 65% background music) to be continuous, smooth, and controlled. If the jagged original vocal-amplitude waveform was used directly to control the balance slider there would be sudden and erratic volume changes in the lead singer's vocals.

In step 305, the output channels are converted from mono to stereo. A karaoke audio stream, whether originally recorded as such or converted from a normal stereo audio stream, will necessarily be mono. This monophonic audio stream is converted to stereo sound by phase shifting frequencies so that a certain frequency will be output from one speaker slightly before being output from the other. This creates a widening of the sound giving a stereo sound effect. After phase shifting the frequencies, the channels are outputted through the karaoke machine loudspeakers to an audience or through headphones for individual listening.

FIG. 4 is a block diagram showing the production of a karaoke audio stream consisting of an instrumental channel and an OMR channel from a typical stereo audio stream (non-karaoke audio stream). This conversion is necessary because a karaoke audio stream consisting of a channel for the OMR and a channel for background music is only needed for the operation of a karaoke machine. In one embodiment of the present invention, these two channels are needed for a variable mixer which mixes these two audio streams for the output. This allows the invention to operate on non-karaoke based audio streams (such as normal audio compact discs).

A normal stereo audio stream is also comprised of two channels. Typically, both channels contain some low-frequency (bass) signals and lead singer vocal signals. These two portions of a song are normally outputted equally from both speakers. This gives the effect that the lead singer and bass signals are in the center of the stereo fields. A particular set of instruments, for example, string instruments or a lead guitar, would be outputted louder from one speaker than the other speaker, depending on the original location of the instruments in the stereo field when it was originally recorded. Both sets of instruments are typically in a high-frequency range. Thus, vocals and bass signals are distributed equally on both channels of a stereo audio stream while other parts of the song are shifted toward one of the two channels comprising the stereo audio stream. This audio stream must be converted so that one channel contains the OMR and the other channel contains only background music.

In FIG. 4 a stereo audio stream 401 is comprised of a left channel 402 and a right channel 403. The left channel carries bass, vocal, and instrument mix A. The right channel carries bass, vocal, and instrument mix B. An adder 404 adds the left channel and the right channel of the audio stream producing audio stream 405. Audio stream 405 contains all the song's vocals, bass, and instruments since instrument mixes A and B are being added. Another characteristic of audio stream 405 is that it is all carried on only one channel and is, therefore, monophonic. Audio stream 405 is routed to two destinations. In one capacity it is routed as audio stream 406 to the output. It comprises the OMR channel of the karaoke audio stream being produced, corresponding to right channel 201 in FIG. 2. Thus, as shown in FIG. 4, audio stream 406 bypasses any further processing and is outputted as one channel of the karaoke audio stream 413. Audio stream 405 is also routed to a digital low-pass filter 407. The purpose of processing audio stream 405 through low-pass pass filter 407 is to produce an audio stream 408 that contains only low-frequency signals which would essentially be the bass part of the song.

Figure 5A:
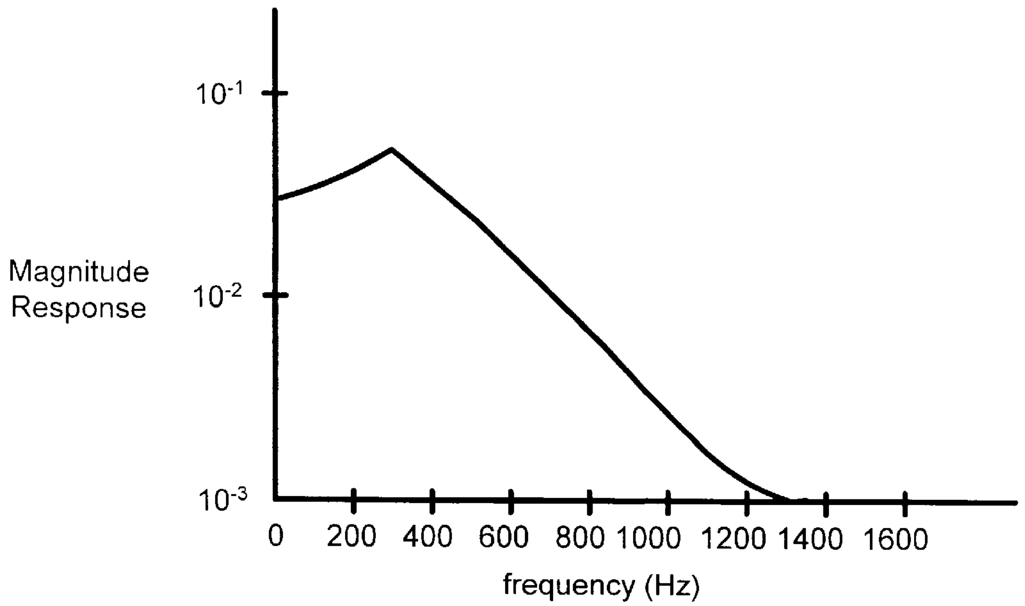
FIG. 5A is a magnitude response graph depicting the performance of the low pass filter.
Figure 5B:
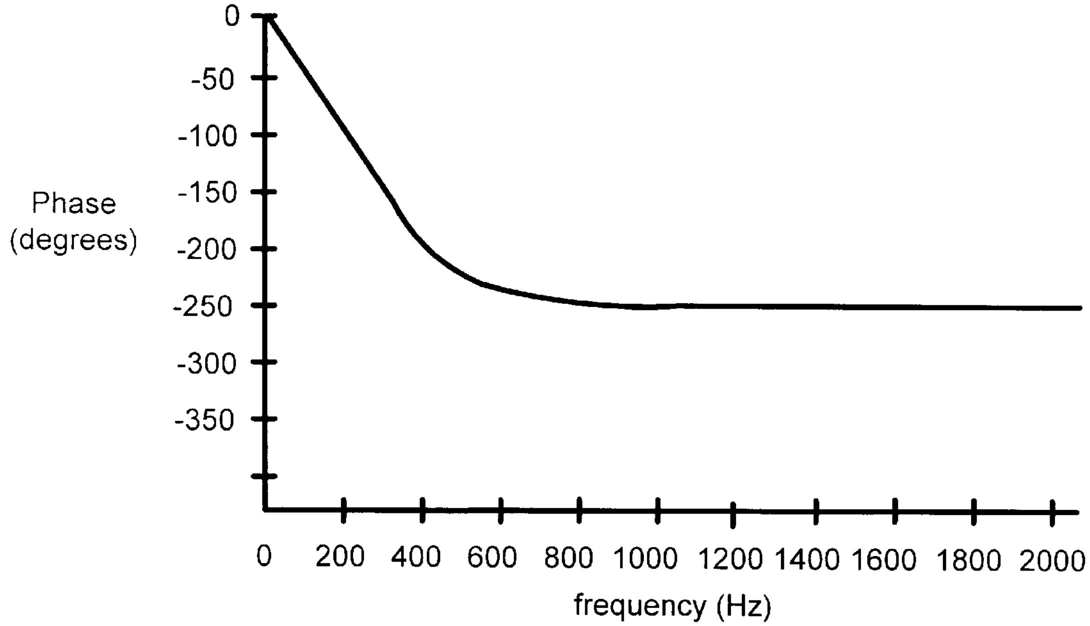
FIG. 5B is a phase graph depicting the performance of the low-pass filter.

The low-pass filter eliminates high-frequency signals in its input audio stream and outputs a low-frequency audio stream. FIG. 5A is a graph showing the performance of a low-pass filter consisting of two biquad filters used in one embodiment of the present invention. It plots magnitude response against frequency. In one embodiment, the low-pass filter begins eliminating or filtering frequencies greater than about 260 Hz. As the graph in FIG. 5A shows, there is a steep decline in magnitude response for frequencies greater than approximately 260 Hz. The frequency at which the filter begins filtering may vary in other embodiments of the present invention. FIG. 5B is a graph plotting phase against frequency for the low-pass filter used in one embodiment of the present invention.

Going back to FIG. 4, at the same time the left channel 402 and right channel 403 of the stereo audio stream are being added, they are also being subtracted from one another by a subtractor 409. By subtracting one channel from the other, the bass and vocal portions are canceled since they are on both channels. Instrument mix A and instrument mix B, though both generally consisting of high-frequency signals, are not affected by the subtractor 409 because they are not equally in the left and right channels. Thus, the output from the subtractor 409 is an audio stream 410 containing only sounds that are not equal in both channels. Audio stream 410 and audio stream 408 outputted from the low-pass filter 407 are then added by adder 411. When these two audio streams are added, an instrumental or background music audio stream 412 is created. Audio stream 412 normally will not contain any of the lead singer's original vocals but can contain background vocals. However, depending on the frequency of the lead vocalist, the low-pass filter may have to be set to eliminate frequencies as low as the lead vocalist's voice. Audio stream 412 comprises the second channel of the karaoke audio stream, corresponding to left channel 202 in FIG. 2.

FIG. 6 is a flowchart showing the steps for creating the virtual singer effect. It shows each step beginning from the karaoke user transmitting sound through a microphone to creating a corresponding audio stream output containing proportional amounts of OMR and background music from the karaoke machine. In step 601, a vocal sensor senses the vocal-amplitude analog signals transmitted through a microphone by a karaoke user. When the karaoke user transmits sound through the microphone, those sound signals are first processed or sensed by the vocal sensor. The vocal sensor detects or senses the vocal-amplitude of the user; that is, how loud the user's voice is and at what rate the volume of the user's voice is changing. In step 602, the analog signals from the karaoke user's voice and the original song audio stream, which may be in karaoke or non-karaoke format, is processed. As shown in more detail in the discussion accompanying FIG. 7 below, the vocal-amplitude signal and the left and right channels of the audio stream are first digitized by digital/analog converters, also known as codecs. A codec is capable of converting analog signals to digital signals and vice versa. Once digitized, the audio streams are processed by a digital signal processor. A processed digital audio stream is routed back to either of the codecs and converted to an analog signal.

In step 603, a digital waveform corresponding to the vocal-amplitude of the karaoke user is compressed. This is done after the user's vocal-amplitude is digitized and while the digital audio stream is being processed by the digital signal processor. The vocal-amplitude waveform is compressed according to a preset amplitude so that the maximum amplitude of the wave will not exceed the set amplitude. This is done to avoid distortion of the OMR output in the event the karaoke user transmits a vocal-amplitude that is too high (e.g. yelling into the microphone). Compressing the digitized vocal-amplitude waveform will ensure that the volume of the original lead singer's vocal will never be outputted through the loudspeakers to the audience above an acceptable maximum volume level. It should be noted that the compression is not done by snipping any portion of the vocal-amplitude waveform that passes the maximum amplitude. Instead, the peak of any wave that exceeds the maximum amplitude is pressed down to the maximum amplitude. This maintains the continuity of the waveform which is important in subsequent steps for creating the smoothed exponential waveform which follows the rises and falls in the vocal-amplitude waveform. If the portions above the maximum amplitude were simply snipped off, there would be discontinuity in the waveform and missing peaks, making the vocals sound distorted.

Step 604 involves further processing by the digital signal processor of the digital waveform. The waveform is simplified before it is used to derive the smoothed exponential waveform. The waveform is simplified by clipping either the top (positive) or bottom (negative) portion of the waveform. This is shown in more detail in FIGS. 8A and 8B. The entire waveform is not needed for the amplitude follower to create the smoothed exponential waveform used by the variable mixer. The amplitude follower can use either the positive or negative portion of the waveform.

Figure 8A:
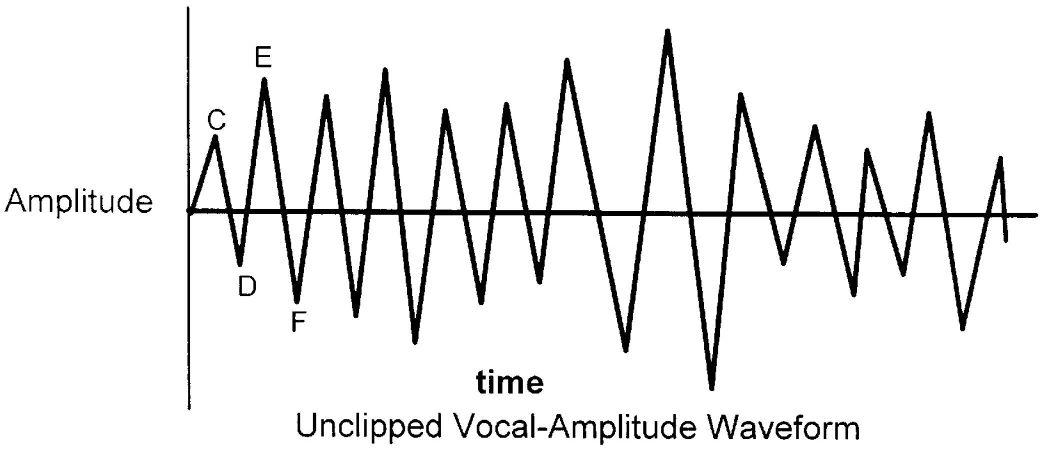
FIG. 8A is a graph of an unclipped vocal-amplitude waveform.
Figure 8B:
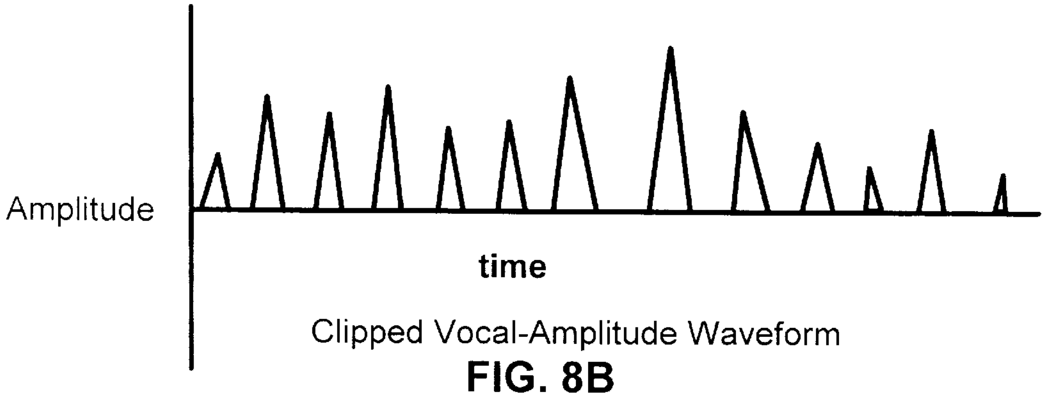
FIG. 8B is a graph of a clipped vocal-amplitude waveform.
Figure 8C:
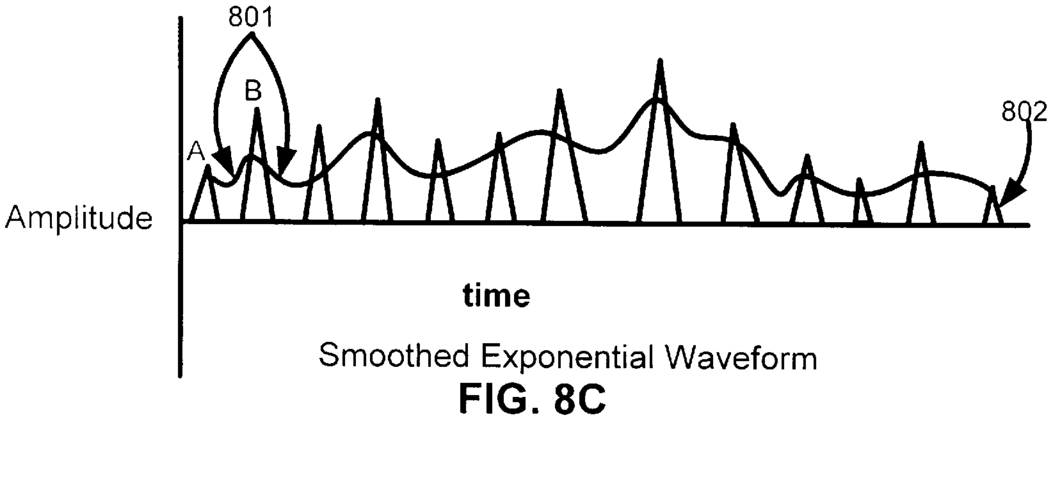
FIG. 8C is a graph of a smoothed exponential waveform superimposed on a clipped vocal-amplitude waveform.

In the next step 605, the amplitude follower takes as input the clipped vocal-amplitude digital waveform and creates a smoothed exponential waveform as shown in FIG. 8C. The clipped digital waveform is a simplified derivative of the complete digital waveform. The complete waveform, as shown in FIG. 8A, is typically very sharp and jagged. This is to be expected given that the volume of the karaoke user's voice is changing, even if only slightly, constantly. The constant changes in volume or vocal-amplitude makes for a sharp and highly-active waveform. Although the volume of the user's voice is constantly changing, it does not sound unnatural to the human ear because the changes are, at least most of the time, being made smoothly and are coming directly from the source (i.e. the karaoke user's vocal chords). However, if the vocal-amplitude waveform were used to control the volume and rate of volume change of the OMR, it would not sound natural to the human ear because if followed exactly, the waveform would cause many rapid and discrete changes in the volume of the OMR. This would not sound natural or pleasant to the human ear because it would be choppy and somewhat erratic. Essentially, the output would sound artificial and processed and, in cases where the karaoke user's vocal-amplitude is changing rapidly, even unintelligible to the audience.

To overcome this unacceptable result, the amplitude follower fits exponential curves that follow the clipped vocal-amplitude waveform. As illustrated in FIG. 8C, the resulting waveform is smooth and gradual, yet still follows the erratic rise and falls in the user's vocal-amplitude. Because it is much smoother and gradual, it can be used to control the OMR output without making it sound choppy or erratic and, thus, more natural and pleasant sounding to the audience. The exponential curve 801 follows the rise in the waveform and more gradually follows the decline in the original vocal-amplitude waveform. If a point B is higher than a point A, an attack rate is used to fit the ramp. In this case the volume of the OMR gradually increases to match the additional energy provided by the karaoke user. If B is lower than A, the decay rate is used to plot the downward slope. Similarly, the volume of the OMR gradually decreases to match the declining energy provided by the karaoke user.

In one embodiment of the present invention, the attack rate equation can be described as follows:

Envelope=Current sample−previous sample+(attack rate *|previous−current|), where the attack rate=$(1-K)^n=1/e$, and where K varies according to attack time and n is the time of rise in samples. In a preferred embodiment of the present invention, the desired attack time is not less than 1 millisecond and not more than 20 milliseconds. The range of possible attack times is from 1 millisecond to 200 milliseconds.

Similarly, in one embodiment of the present invention, the decay rate equation can be described as follows:

Envelope=current sample*decay rate, $K^n=1/e$, where n is the time of decay in samples.

In step 606 the smoothed exponential waveform is inputted into a variable mixer which in turn outputs an audio stream containing a mixture of OMR and background music. Before being used by the variable mixer, the smoothed waveform is normalized. The maximum amplitude of the waveform is set to 1 and the lowest is set to 0. The variable mixer uses the smoothed waveform as a guide for its balance slider. The balance slider can move anywhere between two extreme points. As shown in FIG. 2, the slider 203 can move between points M and L, where M represents all background music and L represents all OMR. For example, if the karaoke user's vocal-amplitude is at the maximum allowable amplitude (i.e. she's singing loudly), the smoothed waveform created by the amplitude follower will be at 1. When read by the variable mixer, it will cause the slider 203 to move to end point L, thus outputting only OMR at the maximum volume. None of the background music channel will be mixed in to lower or dilute the volume of the lead singer's voice in the OMR. On the other extreme, if the karaoke user is not singing or transmitting any sound at all, the smoothed waveform from the amplitude follower will be at 0. This will cause the variable mixer to move its slider to the L end point, thus outputting only background music and no OMR. Most of the time the smoothed exponential waveform will vary according to the karaoke user's vocal-amplitude. In these cases, the variable mixer will smoothly adjust the slider to regulate the amount of OMR and background music outputted. As mentioned above, the volume of the original lead singer's voice in the OMR channel is changed by increasing the background music channel and, likewise, decreasing the OMR channel, thus dissipating or diluting the volume of the original lead singer's voice in the mix. The final result is analogous to the karaoke user controlling the volume and the rate of change in the volume of Frank Sinatra's voice by manually turning a volume dial with her hand. The virtual singer essentially allows her to do this by changing the volume and tempo of her own voice through a microphone.

Figure 7:
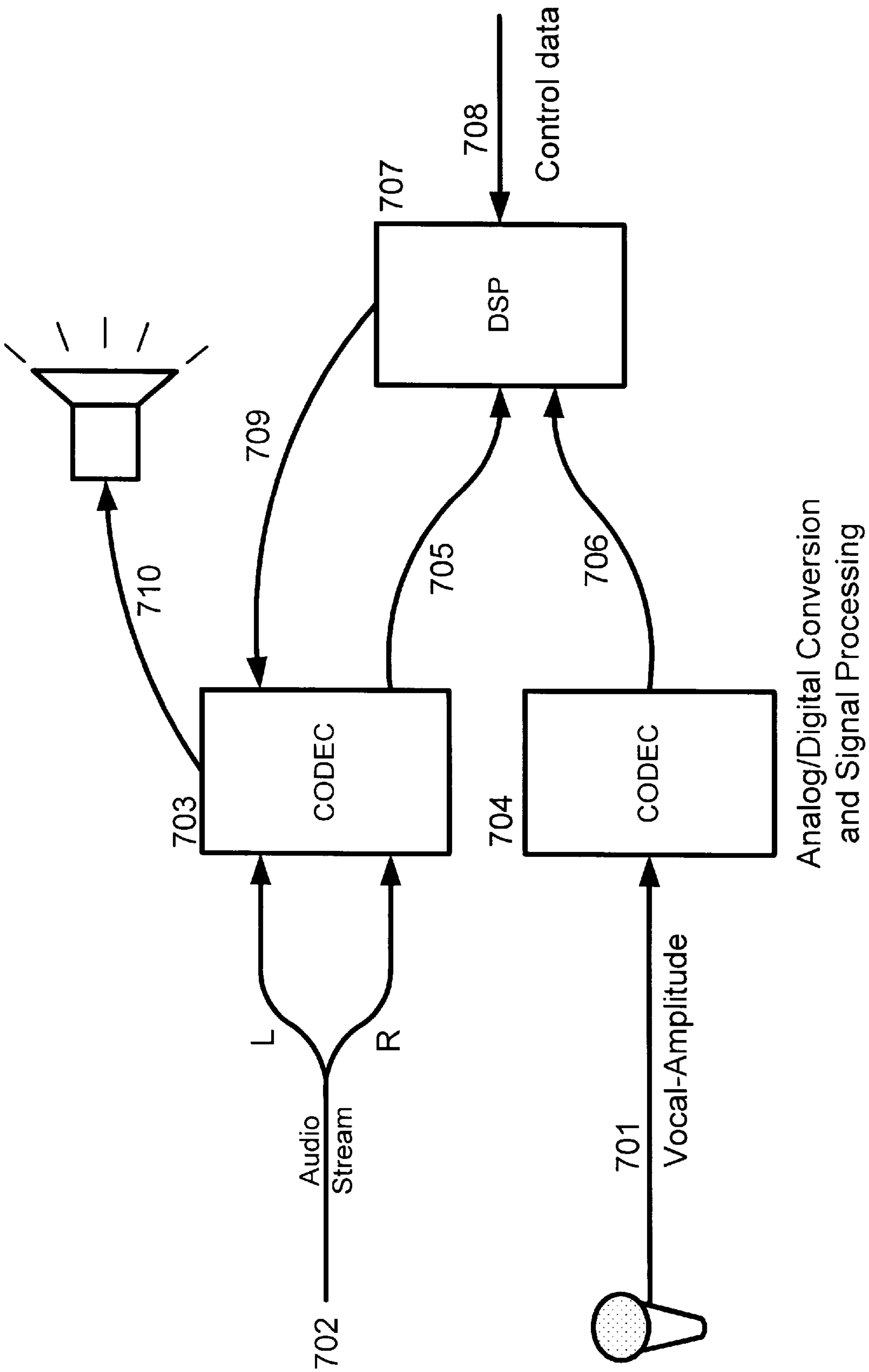
FIG. 7 is a block diagram of the analog/digital conversion and signal processing of the audio streams.

As mentioned above, the vocal-amplitude analog signals must be digitized and then processed by a digital signal processor. FIG. 7 is a block diagram illustrating the analog/digital conversion and signal processing of the vocal-amplitude analog signal and the original song audio stream, which may be in karaoke or normal stereo format. A vocal-amplitude audio stream 701 comes from the vocal sensor which senses the sound being transmitted from the karaoke user through a microphone. The vocal sensor outputs the vocal-amplitude audio stream 701 which is inputted into codec 704. Codecs are capable of converting analog signals to digital or digital signals to analog. The analog waveform of audio stream 701 is converted into a digital stream 706 comprised of bits (0's and 1's). Digital audio stream 706 is inputted into a digital signal processor 707. Similarly, the original song audio stream 702, comprised of two channels, is inputted into a codec 703. The codec converts the analog signals in the audio stream and converts them into a single digital audio stream 705 which is inputted to digital signal processor 707. The digital signal processor 707 also receives control data 708 indicating whether the digital audio stream 705 is from a karaoke audio steam or stereo audio stream. In one embodiment the digital signal processor 707 is an ASP 301 audio digital signal processor manufactured by Aureal Semiconductor in Fremont, Calif. The digital signal processor 707 returns to either codec a processed digital audio stream 709. One of the codecs then converts the digital audio stream 709 back to analog signals. In the embodiment shown in FIG. 7, codec 703 converts the digital audio stream 709 back to analog signals and outputs the analog signals 710 typically to an amplifier and loudspeakers for output.

As discussed above, FIG. 8A is a graph plotting unclipped vocal-amplitude against time. The waveform represents the raw vocal-amplitude of the karaoke user. It should be noted that the negative and positive portions of the wave form are not necessarily the same, and, in fact, are often not the same. Since the human voice fluctuates in volume constantly, the waveform is jagged and rapidly changing. FIG. 8B is the same graph plotting vocal-amplitude amplitude against time with all negative amplitude values clipped or eliminated. This is done to simply the operations performed by the amplitude follower. It is also permissible to clip all positive amplitude values and achieve the same result. The amplitude follower creates a smoothed exponential waveform from the clipped vocal-amplitude waveform. It does this by deriving smoother curves based on the rise and falls in the karaoke user's vocal-amplitude.

The waveform in FIG. 8B is then smoothed by an amplitude follower. The amplitude follower creates an exponential curve 801 characterized by an attack rate governing signal increase and a decay rate governing signal decrease. FIG. 8C is a graph plotting vocal-amplitude against time with a smoothed exponential waveform 802 superimposed on the clipped vocal-amplitude waveform. Exponential curve 801 follows the original vocal-amplitude waveform. If B is higher than A, the attack rate is used to fit the ramp; if B is lower than A, the decay rate is used to plot the downward slope. Exponential curves following the rises and declines comprise the complete smoothed exponential waveform 802. The attack rate uses a time constant, derived from the time of delay in samples and the sampling frequency. The decay rate also uses a time constant, derived from the time of delay in samples and the sampling frequency.

As described above, the smoothed exponential waveform 802 essentially represents the volume of the karaoke user's voice over time. After being normalized, it is used by the variable mixer to control a sliding balance which in turn adjusts the strength of the OMR channel output. If the karaoke user is sending loud sound signals through the microphone, the amplitude follower will create a comparatively high corresponding exponential waveform. Thus, if the karaoke user sings loudly or makes loud noises through the microphone, the original lead singer's voice will also be loud. In one embodiment of the present invention, the sound the karaoke user is transmitting through the microphone is not amplified or outputted to the audience. In other embodiments, some of the karaoke user's voice may be amplified and outputted to the audience. If the karaoke user is singing softly, the corresponding exponential waveform created by the amplitude follower will be low. It should also be noted that because the smoothed exponential waveform 802 is used to control a sliding balance which in turn adjusts the output, the volume of the OMR adjusts smoothly and continuously even given sudden changes in the volume of the karaoke user's voice.

Although the foregoing invention has been described in some detail for purposes of clarity of understanding, it will be apparent that certain changes and modifications may be practiced within the scope of the appended claims. For example, the present invention may be used by more than one karaoke user. The vocal sensor will sense the total vocal-amplitude of the combined voices of the karaoke users. The combined vocal-amplitude will then be converted to a vocal-amplitude waveform. This in turn will be used to create a smoothed exponential waveform by the amplitude follower In general, it should be noted that there are alternative ways of implementing both the process and apparatus of the present invention. It is therefore intended that the following appended claims be interpreted as including all such alterations, permutations, and equivalents as fall within the spirit and scope of the present invention.

What is claimed is:

1. A method for merging a varying amount of an original lead singer vocals with an instrumental audio stream wherein said varying amount of said original lead singer vocals is dependent on a vocal-amplitude analog signal on a karaoke machine comprising:

providing a first input channel and a second input channel;

sensing said vocal-amplitude analog signal;

converting said vocal-amplitude analog signal to a vocal-amplitude digital signal having a vocal-amplitude digital waveform;

smoothing said vocal-amplitude digital waveform and thereby creating a smoothed exponential waveform including ramps and decays in said vocal-amplitude digital waveform; and adjusting the amount of said first input channel in output through an output channel relative to said second input channel according to the strength of said vocal-amplitude analog signal corresponding to said smoothed exponential waveform using a variable mixer to balance between said first input channel and said second input channel.

2. A method as recited in claim 1 wherein said original lead singer vocals from a non-karaoke audio stream is removed by adding an instrumental-only channel and an original mixed recording channel of said non-karaoke audio stream to obtain a doubled low-end audio stream including said original mixed recording, concurrently subtracting said original mixed recording channel from said instrumental-only channel to obtain a non-vocal high-end audio stream, passing said doubled low-end audio stream including said original mixed recording through a low-pass filter to obtain a non-vocal, low-end audio stream which is added to said non-vocal high-end audio stream.

3. A method as recited in claim 2 wherein said low-pass filter frequencies greater than about 260 Hz.

4. A method as recited in claim 1 wherein said vocal-amplitude analog signal is sensed through a microphone.

5. A method as recited in claim 1 further including inputting said first input channel and said second input channel into a first digital/analog converter to create a first digital stream, inputting said vocal-amplitude analog signal into a second digital/analog converter to create a second digital stream, inputting said first digital stream and said second digital stream into a digital signal processor to obtain a third digital stream, and inputting said third digital stream into said first two-way digital/analog converter.

6. A method as recited in claim 5 further including control data being sent to said digital signal processor indicating whether said first digital stream is a karaoke or non-karaoke audio stream.

7. A method as recited in claim 1 further including compressing said vocal-amplitude digital signal having said vocal-amplitude digital waveform by setting a maximum amplitude.

8. A method as recited in claim 1 further including clipping negative portions of said vocal-amplitude digital waveform.

9. A method as recited in claim 1 wherein said ramp is determined from an attack rate dependent on the amount of delay in samples and wherein said decay is determined from a decay rate dependent on the amount of delay in samples.

10. A method as recited in claim 1 wherein said variable mixer mixes said instrumental-only channel and said lead singer original vocal channel and is controlled by the amplitude of said smoothed exponential waveform.

11. A vocal and instrumental merging karaoke machine comprising:

means for providing a first input channel and a second input channel;

means for sensing a vocal-amplitude analog signal;

means for converting said vocal-amplitude analog signal to vocal-amplitude digital signal having a vocal-amplitude digital waveform;

means for smoothing said vocal-amplitude digital waveform thereby creating a smoothed exponential waveform including ramps and decays in said vocal-amplitude digital waveform; and means for adjusting the amount of said first input channel in output through an output channel relative to said second input channel according to the strength of said vocal-amplitude analog signal corresponding to said smoothed exponential waveform using a variable mixer to balance between said first input channel and said second input channel.

12. A karaoke machine as recited in claim 11 further including means for removing an original lead singer vocals from a non-karaoke audio stream by adding an instrumental-only channel and an original lead singer vocals channel of said non-karaoke audio stream to obtain a doubled low-end audio stream including said original lead singer vocals and concurrently subtracting said original lead singer vocals channel from said instrument-only channel to obtain a non-vocal, high-end audio stream, then passing said doubled low-end audio stream including an original lead singer vocals through a low-pass filter thereby creating a non-vocal, low-end audio stream, coupled to a means for adding said non-vocal, low-end audio stream to said non-vocal, high-end audio stream.

13. A karaoke machine as recited in claim 12 wherein said low pass filter filters frequencies greater than about 260 Hz.

14. A karaoke machine as recited in claim 11 further including a microphone means coupled to said means for sensing said vocal-amplitude analog signal.

15. A karaoke machine as recited in claim 11 further including means for inputting said first input channel and said second input channel into a first digital/analog converter to create a first digital stream, inputting said vocal-amplitude analog signal into a second digital/analog converter to create a second digital stream, inputting said first digital stream and said second digital stream into a digital signal processor to obtain a third digital stream, and inputting said third digital stream into said first two-way digital/analog converter.

16. A karaoke machine as recited in claim 15 further including means for sending to said digital signal processor control data indicating whether said first digital stream is a karaoke or non-karaoke audio stream.

17. A karaoke machine as recited in claim 11 further including means for compressing said vocal-amplitude digital signal having said vocal-amplitude digital waveform by setting a maximum amplitude.

18. A karaoke machine as recited in claim 11 further including means for clipping negative portion of said vocal-amplitude digital waveform.

19. A karaoke machine as recited in claim 11 further including means for determining said ramps using an attack rate dependent on the amount of rise in samples and determining said decays using a decay rate dependent on the amount of decay in samples.

20. A karaoke machine as recited in claim 11 wherein said variable mixer mixes said instrumental-only channel and said original mixed recording channel, and is controlled by the amplitude of said smoothed exponential waveform.

21. A vocal and instrumental merging karaoke machine comprising:

a first input channel and a second input channel;

a vocal-amplitude analog signal sensor;

a vocal-amplitude analog/digital signal converter for converting a vocal-amplitude analog signal to a vocal-amplitude digital signal having a vocal-amplitude digital waveform;

an amplitude follower for smoothing said vocal-amplitude digital waveform and thereby creating a smoothed exponential waveform from ramps and decays in said vocal-amplitude digital waveform; and a channel-output adjuster for adjusting the amount of said first input channel output through an output channel relative to second input channel according to the strength of said vocal-amplitude analog signal corresponding to said smoothed exponential waveform using a variable mixer to balance between said first input channel and said second input channel.

22. A karaoke machine as recited in claim 21 further including a vocal remover for removing an original lead singer vocals from a non-karaoke audio stream by adding an instrumental-only channel and an original lead singer vocals channel of said non-karaoke audio stream to obtain a doubled low-end audio stream including said an original lead singer vocals and concurrently subtracting said an original lead singer vocals channel from said instrumental-only channel to obtain a non-vocal, high-end audio stream, then passing said doubled low-end audio stream including said an original lead singer vocals through a low pass filter thereby creating a non-vocal, low-end audio stream, coupled to an audio stream adder for adding varying amounts of said non-vocal, low-end audio stream to said non-vocal, high-end audio stream.

23. A karaoke machine as recited in claim 22 wherein said low-pass filter filters frequencies greater than from about 260 Hz.

24. A karaoke machine as recited in claim 21 further including a microphone coupled to said vocal-amplitude analog signal sensor.

25. A karaoke machine as recited in claim 21 further including a digital signal processor coupled to a first digital/analog converter and a second digital/analog converter wherein said first input channel and said second input channel are inputted into said first digital/analog converter to create a first digital stream, and wherein said vocal-amplitude analog signal is inputted into said second digital/analog converter to create a second digital stream, said first digital stream and said second digital stream are inputted into said digital signal processor to obtain a third digital stream, and said third digital stream is inputted into the first digital/analog converter.

26. A karaoke machine as recited in claim 25 wherein said digital signal processor contains a control switch indicating whether said first digital stream is a karaoke or non-karaoke input stream.

27. A karaoke machine as recited in claim 21 further including a vocal compressor to compress said vocal-amplitude digital signal having said vocal-amplitude digital waveform by setting a maximum amplitude.

28. A karaoke machine as recited in claim 21 further including a signal clipper for clipping negative portion of said vocal-amplitude digital waveform.

29. A karaoke machine as recited in claim 21 further including an attack rate setter to determine said ramps by using the amount of delay in samples and a decay rate setter to determine said decays by using the amount of delay in samples.

30. A karaoke machine as recited in claim 21 wherein said variable mixer mixes said instrumental-only channel and said lead singer original vocal channel, and is controlled by the amplitude of said smoothed exponential waveform.

* * * * *